(12) United States Patent
Mueller et al.

(10) Patent No.: US 7,737,544 B2
(45) Date of Patent: Jun. 15, 2010

(54) SENSOR SYSTEM HAVING A SUBSTRATE AND A HOUSING, AND METHOD FOR MANUFACTURING A SENSOR SYSTEM

(75) Inventors: Stefan Mueller, Wasserburg (DE);
Frieder Haag, Wannweil (DE);
Thomas-Achim Boes, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 477 days.

(21) Appl. No.: 11/601,420

(22) Filed: Nov. 16, 2006

(65) Prior Publication Data
US 2007/0126131 A1    Jun. 7, 2007

(30) Foreign Application Priority Data
Nov. 16, 2005    (DE) .................. 10 2005 054 631

(51) Int. Cl.
*H01L 21/44*    (2006.01)
(52) U.S. Cl. ................ 257/687; 257/678; 257/693; 257/731; 257/787; 257/E21.504

(58) Field of Classification Search ......... 257/787–796, 257/501, 415, 673–731, E21.504, E23.124
See application file for complete search history.

(56) References Cited

U.S. PATENT DOCUMENTS 5,370,518 A * 12/1994 Sasaki et al. ................ 425/147
5,786,626 A *  7/1998 Brady et al. ................ 257/673
6,657,298 B1 * 12/2003 Glenn ........................ 257/730

FOREIGN PATENT DOCUMENTS

DE         199 29 026        12/2000

* cited by examiner

*Primary Examiner*—Dung A Le
(74) *Attorney, Agent, or Firm*—Kenyon & Kenyon LLP

(57) ABSTRACT

A sensor system having a substrate and a housing and a method for manufacturing a sensor system are provided, the housing essentially completely enclosing the substrate in a first substrate region, the housing in a second substrate region being provided at least partially open via an opening, the second substrate region in the region of the opening being provided so as to project from the housing, the housing being manufactured using an injection molding compound and being molded in such a way that the injection molding compound has only one flow front.

21 Claims, 2 Drawing Sheets

SENSOR SYSTEM HAVING A SUBSTRATE AND A HOUSING, AND METHOD FOR MANUFACTURING A SENSOR SYSTEM

FIELD OF THE INVENTION

The present invention is directed to a sensor system having a substrate and a housing.

BACKGROUND INFORMATION

A method for manufacturing a pressure sensor is known from German Published Patent Application No. 199 29 026, in which a semiconductor pressure sensor is mounted on an assembly section of a lead frame, the semiconductor pressure sensor is electrically connected to contact sections of the lead frame, the lead frame together with the semiconductor pressure sensor is inserted into an injection molding tool, and in the injection molding tool the semiconductor pressure sensor is then enclosed in a housing composed of injection molding compound, means being present in the injection molding tool by which a pressure inlet for the semiconductor pressure sensor is recessed into the enclosure and injection molding compound, a plunger being provided in the injection molding tool separated by a gap from the side of the assembly section facing away from the semiconductor pressure sensor. Alternatively, it is known to package sensors which require access to external media, such as pressure sensors, for example, in premold housings. For this purpose the housing mold is first extruded, and the chip is then mounted and appropriately contacted in the prefabricated housing. Since premold housing molds are relatively costly compared to standard mold housings, in the referenced Unexamined German Patent Application attempts have been made to also package pressure sensors in standard mold housings. For example, for this purpose a subregion of the component surface is kept open via a plunger or the like. A disadvantage of all the existing housing molds is that the sensor element is at least partially embedded in a plastic compound. The characteristic curve of the sensor element may be greatly influenced by thermal expansion. This may occur, for example, due to the fact that different thermal expansion coefficients result in stresses in the sensor element which cause erroneous measurements or malfunctions.

SUMMARY OF THE INVENTION

The sensor system according to the present invention having a substrate and a housing and the method according to the present invention for manufacturing a sensor system have the advantage over the related art that the active sensor region of the sensor system may be decoupled much more effectively from the introduction of stress induced by the housing. To this end, the substrate has a first substrate region and a second substrate region, an active sensor region such as a pressure sensor diaphragm or the like being present in the second substrate region, and the second substrate region being provided in such a way that it projects from the housing. In the transition region between the first and second substrate regions the housing has an opening in the second substrate region. Due to the fact that the second substrate region is provided in such a way that it projects from the housing, the housing is designed in such a way that the sensor, i.e., the substrate having the active sensor region, is embedded only on one side, namely in the region of the first substrate region of the sensor, in the mold compound, i.e., in the housing material. This may be achieved according to the present invention, for example, by designing the sensor in the shape of a bar. Thus, the substrate having the sensor element located in the second substrate region, i.e., the active region, is advantageously embedded in the housing only in the first substrate region. A particular advantage also results from the fact that the housing manufactured by using an injection molding compound is molded in such a way that the injection molding compound has only a single flow front. This is true in particular for the part of the housing that is provided for the second substrate region. A single flow front may be implemented, for example, by making the housing simply contiguous, at least with regard to the outer surface of the housing. In other words, in the manufacture of the housing it is not necessary to guide the injection molding compound around both sides of a boundary specified from the outside (namely, for forming the opening in the housing, for example), which would result in the formation of two flow fronts. It is thus possible to avoid formation of a joint line when two flow fronts meet. A joint line generally results in mechanical weakening of the housing, and in addition air may be incorporated when the flow fronts meet, which may result in cavities and defects in the housing.

It is also preferred that the first substrate region and the second substrate region are monolithically connected or enclosed by [a monolithic connection]. In other words, the first and second substrate regions preferably are a continuous substrate material, the division between the first substrate region and the second substrate region occurring only because of the fact that parts of the substrate are embedded in the housing (first substrate region), and parts of the substrate project from the housing (second substrate region). Of course, the substrate may also be a composite substrate material, for example, a semiconductor substrate having a cover wafer, or also may be composite bonded, or also grown substrates such as SOI substrates or the like. It is also preferred to provide an injection molding compound as the housing. For this purpose, proven manufacturing processes for producing housings for semiconductor components or for electronic components in general may be used, in particular the transfer molding process. In this manner a housing is manufactured from an injection molding compound by embedding the component, i.e., a semiconductor sensor system, in the housing.

It is also preferred that the housing partially encloses the second substrate region at a distance, at least in a main plane of the substrate, the housing being open in an angular range in the main plane of the substrate. In this manner, it is advantageously possible according to the present invention for the second substrate region projecting from the housing to be protected from mechanical stresses which might be produced by the housing, while at the same time to also be protected by the housing itself, which, however, is situated at a distance from the substrate in the region of the second substrate region, in particular to be protected from externally acting forces such as from falling or the like. Due to the fact that the housing does not completely enclose, but, rather, at the most partially encloses, the second substrate region, i.e., that the housing is open in an angular range in the main plane of the substrate, the formation of two flow fronts and the associated disadvantages in manufacturing the housing are virtually eliminated. According to the present invention it is also preferred for the second substrate region to have an active region for sensing a detectable variable or multiple detectable variables, the variable or variables being detectable only via an at least indirect contact with a medium for at least a portion of the sensor system. It is thus advantageously possible according to the present invention for the active sensor region on the one hand to be accessible to a medium, for example a fluid under pressure and whose pressure is to be measured, and on the other hand, for economical, simple, and rapid manufacture of the entire sensor system, i.e., including a housing for the substrate having the active region, to still be possible according to the present invention. Alternatively to the existence of a media contact between an active sensor region and a medium, it is naturally also possible to use the sensor system according to the present invention for sensor principles in which no media contact is present or necessary, for example, inertial sensors. Also for such sensor principles not requiring media contact, it is particularly advantageous that introduction of stress, originating from the housing, to the active sensor region is largely avoided. According to the present invention it is also preferred that the first substrate region has contact means for electrical contacting and/or circuit means, and that at the transition between the first substrate region and the second substrate region only comparatively insensitive structures are provided in the substrate. Such comparatively insensitive structures are, for example, conductive tracks which lead or provide contacting lines from the circuit portion in the first substrate region to the active region in the second substrate region. According to the present invention it is thus possible, without loss of efficiency or the like, or without additional costs, to provide a properly functioning transition from the first substrate region to the second substrate region, i.e., in particular an effective seal between the injection molding tool and the substrate for the sensor system during extrusion coating of the first substrate region with the casting compound, solely from an effective placement of the various functional regions on the substrate of the semiconductor system, i.e., sensor system, according to the present invention. It is furthermore preferred to provide a sealing material, in particular a gel or a film, at the transition between the first substrate region and the second substrate region. In this manner it is advantageously possible on the one hand to achieve a greater sealing tightness between the injection molding tool and the substrate, and on the other hand to provide better protection for the substrate structures located in the transition region between the first substrate region and the second substrate region. This also has the result that even more sensitive structures may be localized in this transition region, thus allowing reduction of the overall chip area required for manufacturing the substrate for the sensor system.

A further subject matter of the present invention is a method for manufacturing a sensor system according to the present invention, the housing being manufactured in particular by extrusion coating of the substrate using an injection molding compound, and the substrate being essentially completely enclosed by the housing only in the first substrate region, and the housing being molded in such a way that the injection molding compound has only one flow front. In contrast, the remaining substrate region (second substrate region) projects from the housing. During the extrusion coating for sealing an injection molding tool between the first substrate region and the second substrate region, it is preferred that a portion of the injection molding tool either has direct contact with the substrate, or that during the extrusion coating for sealing an injection molding tool between the first substrate region and the second substrate region a portion of the injection molding tool presses against a sealing material. The sealing material may be introduced into the sensor system during manufacture of the housing, for example by applying the sealing material to the substrate (between the first and second substrate regions) and subsequently encapsulating the housing material, i.e., subsequently embedding, at least partially, also the sealing material in the housing (consumption of the sealing material during manufacture of the housing). Alternatively, the sealing material may also be applied to a portion of an injection molding tool, or at least applied onto same for sealing (for example, in the form of a sealing film or as a soft sealing compound). In this case the sealing material is not embedded, at least not to a significant degree, into the housing.

DETAILED DESCRIPTION

Figure 1:
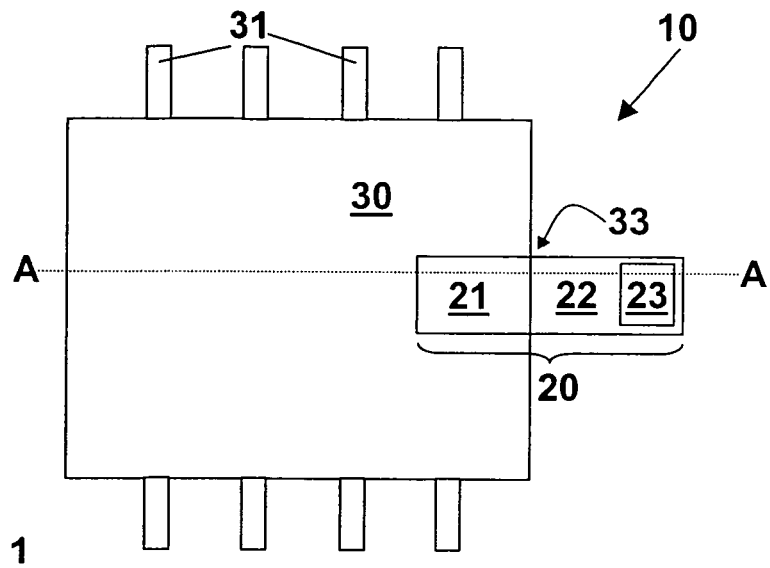
FIG. 1 shows a schematic top view of a sensor system according to the present invention.
Figure 2:
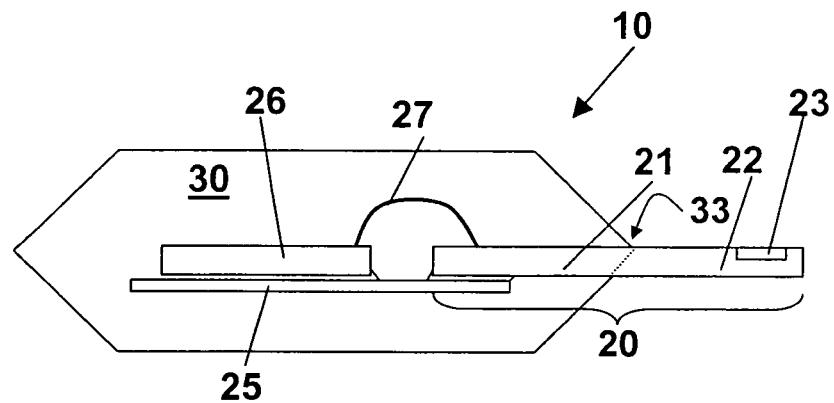
FIG. 2 shows a schematic illustration of a sectional view of a sensor system according to the present invention, with reference to sectional line AA from FIG. 1.

FIG. 1 illustrates a schematic top view of a sensor system 10 according to the present invention. This sensor system 10 includes a housing 30 and a substrate 20. The substrate material is provided in particular as a semiconductor material or as a composite substrate composed of, for example, wafers of the same or different materials. The substrate material is referred to below as substrate 20. Substrate 20 has a first region 21 and a second region 22, an active region 23 in second region 22 which is used for sensing, i.e., detecting, a variable to be measured via the sensor system 10 according to the present invention being separately illustrated. In second substrate region 22 an opening 33 is present in housing 30, in the transition region to first substrate region 21, so that second substrate region 22 is able to project outward. The variable that is detectable via active region 23 in particular is a variable that may be detected solely via use of an at least direct contact between second substrate region 22, i.e., in particular active region 23, and a medium, not illustrated in the figures. The medium may be, for example, a gas whose pressure is to be measured via a pressure measuring diaphragm as an active region 23. The medium, for example air or another gas, must have access to region 23, i.e., in particular to the pressure measuring diaphragm. This access to active region 23 is achieved according to the present invention by the fact that second substrate region 22 projects from housing 30, and that first substrate region 21 is embedded in housing 30. A sectional line AA is illustrated in FIG. 1, and FIG. 2 is a schematic illustration of sensor system 10 according to the present invention according to sectional line AA from FIG. 1. It is apparent from FIG. 1 that in particular connection elements 31 such as, for example, pins or contact legs or the like, project from housing 30. However, according to the present invention it is also possible that no contact elements 31 project from housing 30, but, rather, that contact areas (not illustrated) are present on the top side, bottom side, and/or lateral surfaces of housing 30 which are used for contacting the component, i.e., the sensor system, for example via a flip chip assembly possibility or the like.

FIG. 2 illustrates sensor system 10 according to the present invention, having first substrate region 21, second substrate region 22, active region 23, housing 30, and opening 33. FIG. 2 also indicates a special exemplary embodiment in which in addition to substrate 20 a further substrate 26 is present which, for example, includes additional circuit means for evaluating the signals from active region 23. To this end, substrate 20 and additional substrate 26 are connected to one another via a connecting line 27, in particular in the form of a bond wire 27. In the example of the system of FIG. 2, both substrate 20 and additional substrate 26 are situated on a lead frame 25, or glued to lead frame 25 or attached in another manner.

Figure 3:
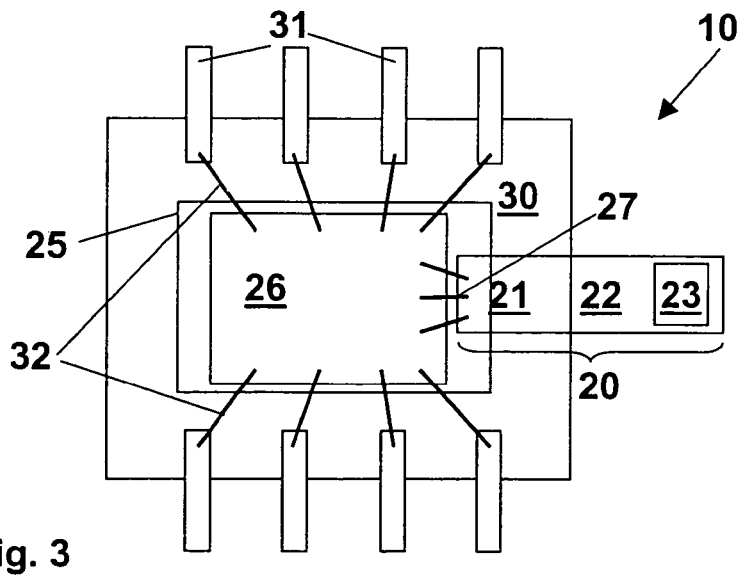
FIG. 3 shows a schematic top view of a sensor system according to the present invention, with additional detail for the interior of the sensor system.

FIG. 3 illustrates a further schematic top view of the sensor system according to the present invention, additional details of the interior of sensor system 10 being visible in FIG. 3, such as, in addition to substrate 20, first substrate region 21, second substrate region 22, active region 23, additional substrate 26 and bond wires 27, and further bond wires 32 for contacting additional substrate 26 with connection elements 31. Lead frame 25 is also illustrated in FIG. 3.

Figure 4:
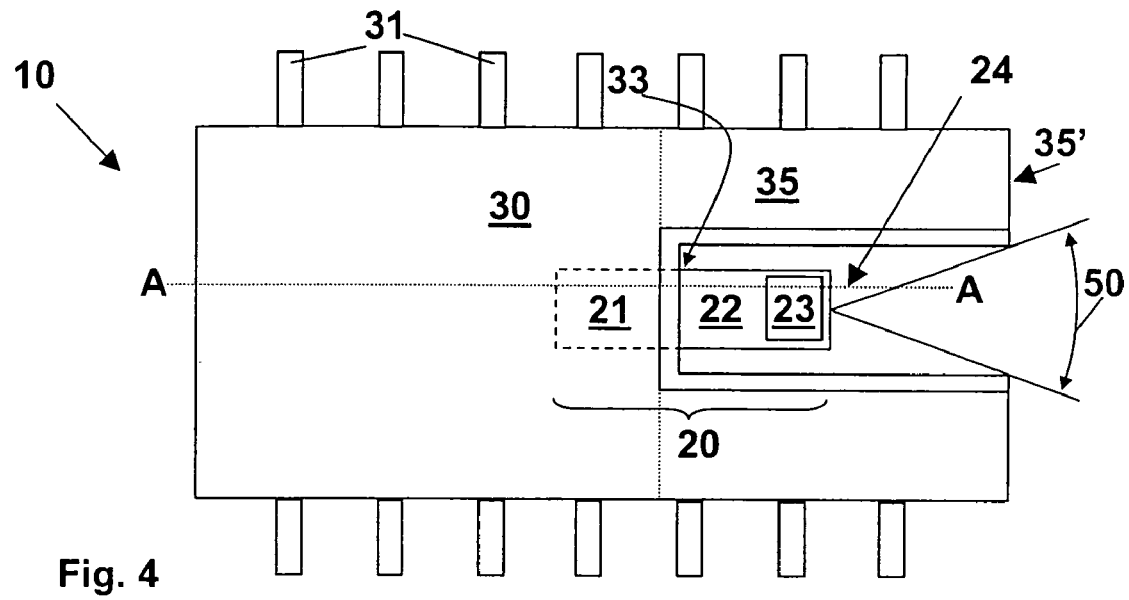
FIG. 4 shows a schematic top view of a second embodiment of a sensor system according to the present invention.

FIG. 4 illustrates a second specific embodiment of sensor system 10 according to the present invention in a schematic top view. Once again, substrate 20 has first substrate region 21 and second substrate region 22, second substrate region 22 including active region 23 and projecting from housing 30 at opening 33. In contrast to the first exemplary embodiment, however, housing 30 has an extension region 35 which extends essentially in the main plane of substrate 20 along second substrate region 22, thereby protecting second substrate region 22 in particular from mechanical effects. However, the advantages of the sensor system according to the present invention are realized in that additional region 35, i.e., extension region 35, of the housing protects second substrate region 22 but exerts no mechanical forces, for example as the result of different temperature coefficients or the like, on second substrate region 22, and in particular on active region 23 of the sensor system. This is due to the fact that extension region 35 maintains a distance from second substrate region 22, this distance being indicated by reference numeral 24 in FIG. 4. According to the present invention, extension region 35 is not closed in the main plane of substrate 20; i.e., second substrate region 22 is not completely enclosed, but instead extension region 35 is partially open. This may be represented by an angular range 50 in which extension region 35 is open, i.e., not enclosed by the housing in the main plane of substrate 20. This situation may also be represented by the fact that extension region 35 of the housing is provided essentially as a simple connection; i.e., the housing material extends from one side via an injection molding compound without forming two flow fronts which meet in the course of the injection molding. For example, the injection molding tool may be de-aerated at one end 35' of the extension region during the injection molding. FIG. 4 also shows a sectional line AA, and FIG. 5 essentially illustrates a sectional view (with certain deviations) along sectional line AA from FIG. 4.

Figure 5:
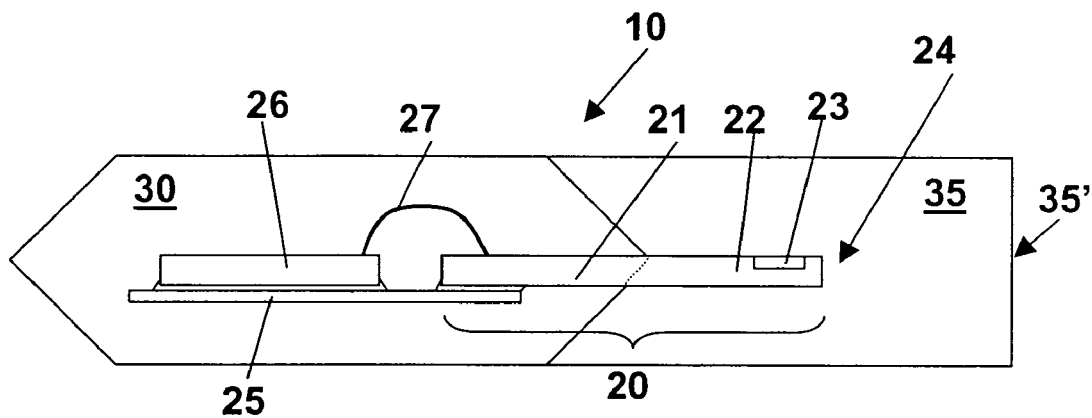
FIG. 5 shows a schematic sectional view of the second embodiment of the sensor system according to the present invention, with reference to sectional line AA from FIG. 4.

FIG. 5 illustrates the above-referenced schematic sectional view along sectional line AA (with deviations) from FIG. 4, sensor system 10 according to the present invention once again including substrate 20, first substrate region 21, second substrate region 22, active region 23, additional substrate 26, extension region 35, end 35' of extension region 35 which is preferably provided for de-aeration, and lead frame 25.

Figure 6:
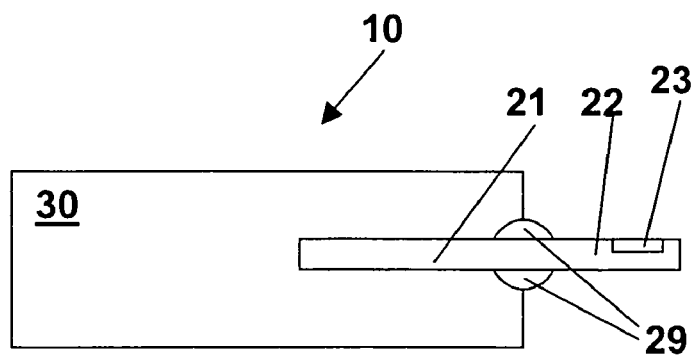
FIG. 6 shows a schematic sectional view of a third embodiment of a sensor system according to the present invention.

FIG. 6 schematically illustrates a third specific embodiment of the sensor system according to the present invention, substrate 20 once again including first substrate region 21, second substrate region 22, and active region 23, except that in the transition region between first substrate region 21 and second substrate region 22, i.e., in the region of opening 33, a sealing material 29 is provided which is used in the manufacture of housing 30 of sensor system 10, in that an injection molding tool (not illustrated) of an apparatus for extrusion coating of first substrate region 21 with the housing material need not make direct contact, i.e., need exert no direct pressure forces on substrate 20 in the transition region between first substrate region 21 and second substrate region 22, but, rather, presses against sealing material 29 and thus protects the structures present in this substrate region from these pressure forces to be applied. The material of housing 30 may thus be filled in the region to be extrusion coated (first substrate region 21) at the required pressure and temperature, which in addition does not result in impairment of the speed of the manufacturing process for sensor system 10 according to the present invention. Specifically, one of the main problems in extrusion coating of only one subregion 21 of substrate 20 is that sealing the tool with respect to the molding compound, i.e., the injection molding compound of housing 30, entails potential problems. Because of tolerances, excess pressure must be exerted during sealing, since otherwise excess plastic compound (flash) flows into active region 23 of the sensor, i.e., substrate 20, resulting in objectionable coatings on the injection molding compound at that location. To remedy this problem, according to the present invention in the region of the transition between the first and second substrate regions, i.e., in the region of a required sealing via the injection molding tool, either only printed conductors are present instead of active structures, or a seal is avoided by pressing the tool directly onto the silicon and the seal is achieved via soft compounds, for example gels or films. A further possibility according to the present invention is to provide no active, i.e., sensitive, structures in the region of a required seal, and also to provide a seal using soft compounds (sealing material 29). According to the present invention, sealing material 29 may either be embedded in housing 30, as illustrated in FIG. 6 (i.e., the sealing material remains on finished sensor system 10), or in an alternative embodiment not illustrated, in particular for the method according to the present invention, may be provided only on the injection molding tool so that the injection molding tool for the sealing presses on substrate 20 not with a "hard" material, but instead with a soft material such as a film or a gel. In the latter case, sealing material 29 is not embedded, at least not in significant parts, in housing 30.

It is more difficult to seal the side of the silicon, since angular rotation may contribute to the formation of gaps. It is advantageous to provide the active area of the sensor on the top side of the bar, i.e., of substrate 20 projecting in second substrate region 22, so that a slight lateral flash formation (i.e., on the lateral narrow sides of substrate 20) is not critical for functioning of the sensor. Of course, the third specific embodiment of sensor system 10 according to the present invention may be combined with the first and/or second specific embodiment.

According to the present invention it is also possible to separate the sensor from the evaluation electronics, i.e., to provide a two-chip module inside sensor system 10, as illustrated in FIGS. 2, 3, and 5, or also for the sensor, i.e., substrate 20, to already include the evaluation electronics, thus making an additional substrate 26 unnecessary, so that sensor system 10 may be implemented as a one-chip module.

The first specific embodiment of sensor system 10 according to the present invention (FIGS. 1, 2, and 3) is particularly advantageous when the smallest possible dimensions of the sensor system are intended, or the sensor element, for example for biosensors or the like, is to be immersed in a liquid or a fluid in general which is not to contact the molding compound, i.e., the injection molding compound of housing 30. The housing mold for sensor system 10 according to the second embodiment (FIGS. 4 and 5), in which extension region 35 of housing 30 extends all around second substrate region 22 and protects active region 23, provides maximum protection against mechanical influences on sensor element 23, i.e., active region 23 of sensor system 10. According to the present invention, second substrate region 22 contacts housing 30 on only one of the housing sides (i.e., does not contact extension region 35 at all). According to the present invention, housing 30 may be a housing mold having pins, i.e., connecting legs, or may also be a modern "leadless" form.

What is claimed is:

1. A sensor system, comprising:
    a substrate; and
    a housing completely enclosing the substrate in a first substrate region, the housing in a second substrate region being at least partially open via an opening;
    wherein the second substrate region in the region of the opening projects from the housing so that the second substrate region does not contact the housing, the second substrate region having an active region for sensing one or more variables which are detectable only via an at least indirect contact of at least part of the sensor system with a medium, and
    wherein the housing does not have joint lines because it is manufactured using an injection molding compound and molded in such a way that the injection molding compound has only one flow front.

2. The sensor system as recited in claim 1, wherein the substrate is embedded in the housing only in the first substrate region.

3. The sensor system as recited in claim 1, wherein the first substrate region and the second substrate region are monolithically connected.

4. The sensor system as recited in claim 1, wherein the housing at least partially encloses the second substrate region at a distance, at least in a main plane of the substrate.

5. The sensor system as recited in claim 1, wherein the housing encloses the second substrate region at a distance in a main plane of the substrate, the housing being open in an angular range in the main plane of the substrate.

6. The sensor system as recited in claim 1, wherein the first substrate region has contact means for electrical contacting and/or circuit means, and at the transition between the first substrate region and the second substrate region only comparatively insensitive structures are provided in the substrate.

7. The sensor system as recited in claim 1, wherein a sealing material corresponding to a gel or a film is provided at the transition between the first substrate region and the second substrate region.

8. A method for manufacturing a sensor system, comprising:
    manufacturing a housing by extrusion coating of a substrate using an injection molding compound, the substrate being essentially completely enclosed by the housing only in a first substrate region and being exposed in a second substrate region that projects from the housing so that the second substrate region does not contact the housing, the second substrate region having an active region for sensing one or more variables which are detectable only via an at least indirect contact of at least part of the sensor system with a medium and the housing being molded in such a way that the injection molding compound has only one flow front.

9. The method as recited in claim 8, wherein during the extrusion coating for sealing an injection molding tool between the first substrate region and the second substrate region a portion of the injection molding tool either has direct contact with the substrate, or during the extrusion coating for sealing an injection molding tool between the first substrate region and the second substrate region a portion of the injection molding tool presses against a sealing material.

10. The method as recited in claim 8, wherein the first substrate region and the second substrate region are monolithically connected.

11. The method as recited in claim 8, wherein the housing at least partially encloses the second substrate region at a distance, at least in a main plane of the substrate.

12. The method as recited in claim 8, wherein the housing encloses the second substrate region at a distance in a main plane of the substrate, the housing being open in an angular range in the main plane of the substrate.

13. The method as recited in claim 8, wherein the first substrate region has contact means for electrical contacting and/or circuit means, and at the transition between the first substrate region and the second substrate region only comparatively insensitive structures are provided in the substrate.

14. The method as recited in claim 8, wherein a sealing material corresponding to a gel or a film is provided at the transition between the first substrate region and the second substrate region.

15. The sensor system as recited in claim 1, wherein the substrate is embedded in the housing only in the first substrate region, and wherein the first substrate region and the second substrate region are monolithically connected.

16. The sensor system as recited in claim 15, wherein the housing at least partially encloses the second substrate region at a distance, at least in a main plane of the substrate.

17. The sensor system as recited in claim 15, wherein the housing encloses the second substrate region at a distance in a main plane of the substrate, the housing being open in an angular range in the main plane of the substrate.

18. The sensor system as recited in claim 15, wherein the first substrate region has at least one of a contact arrangement for electrical contacting and a circuit arrangement, and at the transition between the first substrate region and the second substrate region only comparatively insensitive structures are provided in the substrate.

19. The sensor system as recited in claim 15, wherein a sealing material corresponding to a gel or a film is provided at the transition between the first substrate region and the second substrate region.

20. The sensor system as recited in claim 15, wherein the housing at least partially encloses the second substrate region at a distance, at least in a main plane of the substrate, wherein the first substrate region has at least one of a contact arrangement for electrical contacting and a circuit arrangement, and at the transition between the first substrate region and the second substrate region only comparatively insensitive structures are provided in the substrate, and wherein a sealing material corresponding to a gel or a film is provided at the transition between the first substrate region and the second substrate region.

21. The sensor system as recited in claim 15, wherein the housing encloses the second substrate region at a distance in a main plane of the substrate, the housing being open in an angular range in the main plane of the substrate, wherein the first substrate region has at least one of a contact arrangement for electrical contacting and a circuit arrangement, and at the transition between the first substrate region and the second substrate region only comparatively insensitive structures are provided in the substrate, and wherein a sealing material corresponding to a gel or a film is provided at the transition between the first substrate region and the second substrate region.

* * * * *